LEAD BENDING GUIDE DEVICE

Filed Dec. 30, 1963

INVENTORS:
HAROLD D. HUTCHINSON
WILLIAM C. GREGGE
BY
Elliott & Pastoriza
ATTORNEYS 3,212,368
Patented Oct. 19, 1965

3,212,368
LEAD BENDING GUIDE DEVICE

Harold D. Hutchinson and William C. Gregge, both of 1009 Montana Ave., Santa Monica, Calif.

Filed Dec. 30, 1963, Ser. No. 334,266
3 Claims. (Cl. 81—5.1)

This invention relates to a novel device for facilitating the bending of leads such as the oppositely extending leads from an electrical component at precise points so that the lead ends may readily be connected to terminal points on a circuit board.

In wiring electrical circuits employing printed circuit boards, various components such as diodes, transistors, condensers, resistors, and so forth, are soldered between spaced terminal points in the circuit board. The electrical components themselves are supplied in a form in which the electrical leads extend generally in straight line directions from opposite ends of the component. The various terminal points on the board are spaced at different distances usually dictated by the manner in which the printed circuit is laid out on the board. It is therefore necessary to bend the leads, usually through 90°, such that their ends will be properly spaced to facilitate connection to the spaced terminals. The foregoing operation is often carried out by hand and the points at which the leads are bent are estimated in accordance with the appearance of the spacing between the terminals. While some error can be tolerated, in certain specifications it is required that the leads be bent through a given radius at precise points corresponding within a strict tolerance to the exact spacing of the terminals. Accordingly, if the bends are not correctly made in the first instance, the leads must be straightened and re-bent at other points. Such action is not only time consuming but also weakens the leads.

Heretofore, it has been proposed to provide a mechanical device having spaced shoulders upon which an elecical component is positioned. These shoulders are spaced at the precise points at which the leads are to be bent, but since the spacing is fixed, the device is only useful for connections to terminals spaced a corresponding distance. If the spacing between the terminals is different, another mechanical device in which the shoulders are properly spaced must be provided.

With all of the foregoing in mind, it is a primary object of this invention to provide an improved mechanical device to facilitate the bending of component leads in which an adjustment may be made to enable bending of the component leads at precise points to correspond with the spacing between the particular terminals involved. By means of such a device, the bending of leads is greatly accelerated to the end that terminal boards may be fabricated far more quickly than has been possible heretofore.

More particularly, it is an object to provide a lead bending guide device enabling the bending of oppositely extending leads from an electrical component at precise points through substantially a right angle about a precise radius so that the ends of the leads are spaced a desired distance apart corresponding to a given distance between terminal points to which the ends of the leads are to be connected.

Another important object is to provide a lead bending guide device which may be operated with one hand to adjust the spacing between the bending points so that the electrical component itself may be positioned with the person's other hand and the bends effected with the other hand all in a single motion.

Briefly, these and many other objects and advantages of this invention are attained by providing a pair of members supporting first and second clamping means at a given spacing. The members themselves terminate in reference points and are coupled to each other for movement towards and away from each other. The arrangement is such that the reference points may be positioned to register with two terminals between which an electrical component is to be connected. The electrical component itself is then inserted in the first and second clamping means and the clamping means actuated to hold the component leads in place. The leads may then be bent at precise points about a given radius defined by the members at the clamping points. When the component is released, the ends of the leads will then be properly spaced for connection to the terminals in question.

A better understanding of the invention will be had by now referring to a preferred embodiment thereof as illustrated in the accompanying drawings, in which.

Figure 1:
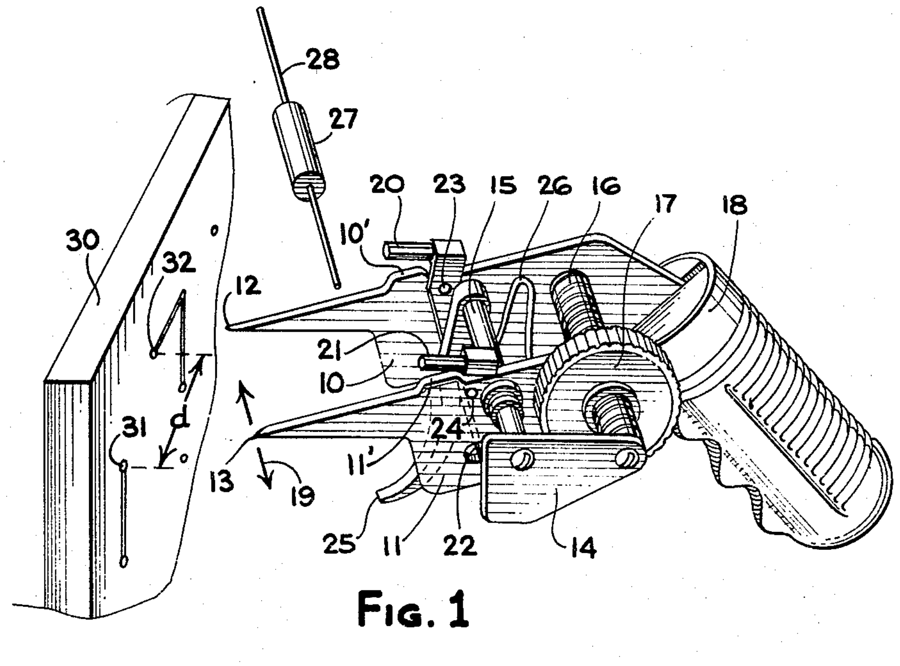
FIGURE 1 is a perspective view of the lead bending guide device of this invention.
Figure 2:
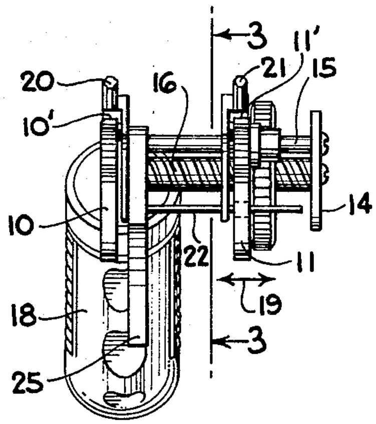
FIGURE 2 is a front elevational view thereof.

Referring to FIGURES 1 and 2, the device comprises a frame means including first and second plate members 10 and 11 disposed in generally parallel relationship. As shown, these plate members respectively include upper edges 10' and 11' which extend in forward directions to terminate in first and second reference points 12 and 13. An end frame plate 14 serves to anchor a guide rod 15 secured to the first plate 10 and passing through a journal opening in the second plate 11. The same frame plate 14 also serves to anchor one end of a lead screw 16 having its other end passing through the plate 11 and secured to the plate 10. A nut 17 is threaded to the lead scew 16 and coupled to the plate 11 to move the plate 11 along the screw 16 upon rotation.

The entire structure may be easily held by a pistol grip 18 secured to the rear portion of the first plate member 10. By this arrangement, a person may grasp the grip 18 and with his thumb rotate the nut 17 to cause the second plate 11 to travel back and forth on the lead screw 16. The movement is stabilized by the guide rod 15. This action will vary the distance between the plates 10 and 11 and thereby vary the distance between the end points 12 and 13 as indicated by the double-headed arrow 19.

Each of the plate members 10 and 11 support first and second clamping means 20 and 21. These clamping means have their lower ends coupled to a cross bar 22 and have their upper ends pivoted as at 23 and 24 to the plates 10 and 11, respectively. The cross bar 22, as best shown in FIGURE 2, serves as an actuating member for the first and second clamping means 20 and 21. Since the clamping means 21 is pivoted to the second plate 11, it will move with the plate so that the distance between the clamping means 20 and 21 will be varied when the distance between the plates and the points 12 and 13 is varied.

Figure 3:
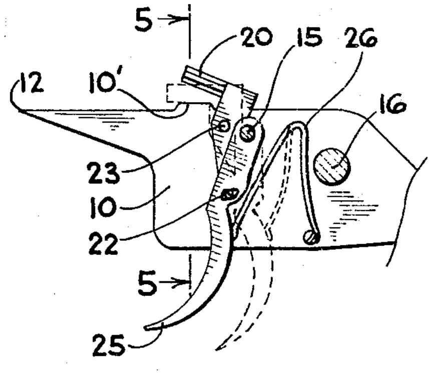
FIGURE 3 is a fragmentary cross-section taken in the direction of the arrows 3—3 of FIGURE 2.

The clamping means are actuated by a trigger element 25 pivotably mounted to the guide rod 15 and depending downwardly therefrom. As best shown in FIGURE 3, the rear part of the trigger 25 is coupled to the cross bar 22. Thus, it will be clear that when the trigger is pulled in a rearward direction to the dotted line position, it will swing the bar 22 rearwardly and thereby pivot the first and second clamping elements 20 and 21 about the pivot points 23 and 24 so that these elements will engage the upper edges 10' and 11' of the plates 10 and 11, respectively.

A hair spring 26 may serve as a biasing means for normally urging the trigger 25 to its solid line position so that the clamping means 20 and 21 will normally be open.

Referring again to FIGURE 1, there is shown an electrical component 27 having oppositely extending leads 28 and 29. Also shown is a terminal board 30 including printed circuit portions having terminals such as 31 and 32. In order to connect the component 27 with its oppositely extending leads 28 and 29 to the terminals 31 and 32, it is necessary to bend these leads at precise points such that the extreme ends thereof will be spaced in accordance with the spacing *d* between the terminals 31 and 32.

In the operation of the lead bending guide device of FIGURE 1, an operator will accordingly grasp the pistol grip 18 and with his right thumb rotate the nut 17 to adjust the spacing between the points 12 and 13 to correspond to the spacing between the terminals 31 and 32. This operation may be readily achieved by simply referencing the points 12 and 13 to the terminals 31 and 32 and making the adjustment so that the points are in alignment with the terminals. In many instances the terminals define small openings within which the points 12 and 13 may be inserted to facilitate the spacing adjustment. In this respect, the points themselves are properly formed to be received in such openings.

The operator will then position the electrical component 27 so that the oppositely extending leads 28 and 29 fall under the clamping means 20 and 21. Pulling backwardly on the trigger 25 will then clamp the leads against the upper edges 10' and 11' of the plate members at precise points on the leads 28 and 29, respectively. The operator will then use his other hand to bend the leads 28 and 29 downwardly against the outside exterior flat faces of the plates 10 and 11. Since the plane of the top edges 10' and 11' at the clamping points is at 90 degrees to the outside faces of the plates, the leads will be bent through substantially 90 degrees.

Figure 4:
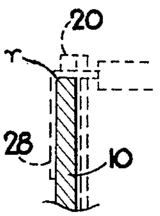
FIGURE 4 is a fragmentary cross-section taken in the direction of the arrows 5—5 of FIGURE 3; and, FIGURE 5 illustrates an electrical component having oppositely extending leads bent by means of the device of this invention.

Referring particularly to FIGURE 4, it will be noted that the clamping edge 10' includes a slight radius *r* at its outside edge. This radius is important in providing a proper radius at the bend point in the wire lead. Further, it will be noted that the lead is held immediately adjacent to the initial point of the bend so that the portion of the lead between the edge 10' and the component itself will not bend or buckle or bow upwardly when the bend is effected.

After the bending operation, the trigger 25 is released and the clamping means 20 and 21 will then be raised by the biasing spring 26. The component 27 may then be removed and the lower ends of the leads 28 and 29 will then be properly spaced to be connected to the terminals 31 and 32.

Figure 5:
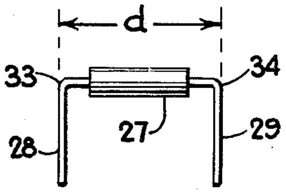

FIGURE 5 shows the appearance of the component 27 after the leads 28 and 29 have been bent with a proper radius as shown at 33 and 34.

If the electrical component is to be connected between other terminals of different spacing from that of the terminals 31 and 32, the end points 12 and 13 of the device are simply referenced to the new terminals and an adjustment is effected by rotating the thumb nut 17. This action will adjust the spacing between the clamping means 20 and 21 so that bending of the leads of the component when properly gripped will be at those precise points necessary so that the ends will register with the new terminals.

By using spaced parallel plate members 10 and 11 as described, there is room between the members to accommodate the component from which the leads extend. Thus various different shaped components can be received between the plates without interfering with the device. Moreover, this room permits the leads to be bent at asymmetrically spaced points relative to the component itself by shifting the component closer to one plate than the other prior to bending.

From the foregoing description, it will thus be evident that the present invention has provided a greatly improved device for facilitating the bending of electrical leads. While one particular embodiment of the device has been shown and described, it will be evident to those skilled in the art that various changes may be made which fall clearly within the scope and spirit of the invention. The lead bending guide device is therefore not to be thought of as limited to the exact construction set forth merely for illustrative purposes.

What is claimed is:

1. A lead bending guide device for enabling the bending of leads at precise points so that the ends of said leads are spaced a desired distance apart corresponding to a given distance between terminals to which said leads are to be connected, comprising, in combination: a frame structure including a first member terminating in a first point; a second member terminating in a second point; means coupled to said first and second members for adjusting the distance between said points; and first and second clamping means carried by said members so that the distance between said clamping means corresponds to the distance between said points, said first and second members having upper edges defining a radius at their outside portions, said clamping means clamping said leads against said upper edges, whereby said distance between said clamping means may be adjusted by referencing said points to said terminals, and said leads then held in said clamping means and bent about said radius at said precise points.

2. A lead bending guide device for enabling the bending of oppositely extending leads from an electrical component at precise points through substantially a right angle so that the ends of said leads are spaced a desired distance apart corresponding to a given distance between terminal points to which said ends of said leads are to be connected, comprising, in combination: first and second plate members disposed generally in parallel relationship to each other and terminating in points spaced a distance from each other corresponding to the distance between said plates; a threaded screw secured to said first plate and extending normally therefrom, said second plate having an opening receiving said screw and including a nut threaded on said screw for rotation and coupled to said second plate so that rotation of said nut in first and second directions causes said second plate to travel towards and away from said first plate along said threaded screw; and first and second lead clamping means carried on said first and second plates respectively for receiving said oppositely extending leads, whereby the distance between said plates may be initially adjusted by rotation of said nut to space said points to correspond to said given distance between said terminal points and said oppositely extending leads then clamped by said clamping means and bent at the points of engagement by said clamping means through right angles.

3. A device according to claim 2, including a pistol-type grip member secured to said first plate; a guide rod secured to said first plate and passing through an opening in said second plate; trigger means pivoted to said guide rod and coupled to said first and second clamping means to close said clamping means in response to pulling of said trigger means: and biasing means urging said trigger means in a direction normally holding said clamping means open.

References Cited by the Examiner

UNITED STATES PATENTS

| | | | |
|---|---|---|---|
| 1,001,248 | 8/11 | Campbell | 81—6 |
| 1,170,334 | 2/16 | Riggs | 81—303 |
| 2,367,689 | 1/45 | Providence | 81—13 |
| 2,390,310 | 12/45 | Knowles | 81—311 X |
| 3,130,484 | 4/64 | Zdanis. | |

WILLIAM FELDMAN, *Primary Examiner.*

MICHAEL BALAS, *Examiner.*